United States Patent
Ando et al.

(10) Patent No.: US 10,727,407 B2
(45) Date of Patent: Jul. 28, 2020

(54) RESISTIVE SWITCHING MEMORY WITH REPLACEMENT METAL ELECTRODE

(71) Applicant: INTERNATIONAL BUSINESS MACHINES CORPORATION, Armonk, NY (US)

(72) Inventors: Takashi Ando, Tuckahoe, NY (US); Hiroyuki Miyazoe, White Plains, NY (US); Seyoung Kim, Weschester, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 16/058,428

(22) Filed: Aug. 8, 2018

(65) Prior Publication Data

US 2020/0052207 A1    Feb. 13, 2020

(51) Int. Cl.
*H01L 47/00* (2006.01)
*H01L 45/00* (2006.01)
*H01L 27/24* (2006.01)

(52) U.S. Cl.
CPC ...... *H01L 45/1633* (2013.01); *H01L 27/2436* (2013.01); *H01L 27/2463* (2013.01); *H01L 45/08* (2013.01); *H01L 45/1253* (2013.01); *H01L 45/145* (2013.01); *H01L 45/146* (2013.01); *H01L 45/147* (2013.01)

(58) Field of Classification Search
None
See application file for complete search history.

(56) References Cited

U.S. PATENT DOCUMENTS

| | | | |
|---|---|---|---|
| 9,130,167 B2 | 9/2015 | Murase et al. | |
| 9,293,701 B2 | 3/2016 | Choi et al. | |
| 9,343,677 B2 | 5/2016 | Smythe, III et al. | |
| 9,461,245 B1* | 10/2016 | Yang | H01L 45/1253 |
| 9,548,449 B2 | 1/2017 | Karpov et al. | |
| 9,754,665 B2 | 9/2017 | Chen et al. | |
| 9,768,379 B2 | 9/2017 | Gassilloud et al. | |
| 9,780,145 B2 | 10/2017 | Chang et al. | |
| 2016/0049584 A1* | 2/2016 | Dang | H01L 45/08 |
| | | | 257/4 |

(Continued)

OTHER PUBLICATIONS

Hayakawa et al., "Highly reliable TaOx ReRAM with centralized filament for 28-nm embedded application", 2015 Symposium on VLSI Technology Digest of Technical Papers. Jun. 16-18, 2015. pp. 1-2.

(Continued)

*Primary Examiner* — Hung K Vu
(74) *Attorney, Agent, or Firm* — Tutunjian & Bitetto, P.C.; Vazken Alexanian

(57) ABSTRACT

A method is presented for facilitating oxygen vacancy generation in a resistive random access memory (RRAM) device. The method includes forming a RRAM stack having a first electrode and at least one sacrificial layer, encapsulating the RRAM stack with a dielectric layer, constructing a via resulting in removal of the at least one sacrificial layer of the RRAM stack, the via extending to a high-k dielectric layer of the RRAM stack, and forming a second electrode in the via such that the second electrode extends laterally into cavities defined by the removal of the at least one sacrificial layer.

15 Claims, 6 Drawing Sheets

(56) References Cited

U.S. PATENT DOCUMENTS

2017/0207387 A1\* 7/2017 Yang .................. H01L 45/1253
2018/0069051 A1 3/2018 Ueki et al.

OTHER PUBLICATIONS

Kim et al., "Impact of oxygen exchange reaction at the ohmic interface in Ta2O5-based ReRAM devices", Nanoscale. Royal Society of Chemistry. Aug. 15, 2016. pp. 1-8.
Liu et al., "Experimental Characterization of Physical Unclonable Function Based on 1 kb Resistive Random Access Memory Arrays", IEEE Electron Device Letters. vol. 36. Issue 12. Dec. 2015. pp. 1380-1383.
Wong et al., "Metal-Oxide RRAM", Proceedings of the IEEE. vol. 100. Issue 6. Jun. 2012. pp. 1951-1970.

\* cited by examiner ary access memory (RRAM) cells with replacement metal electrodes such that at least one sacrificial layer is removed during the RRAM cell formation, where the at least one sacrificial layer can be, e.g., a titanium nitride (TiN) layer. As a result, the replacement top electrode directly contacts sidewalls of a via such that depressions or recesses defined by the removal of the sacrificial top electrode are occupied by the replacement top electrode. The replacement top electrode can be, e.g., a titanium (Ti) layer. Ti is employed because it facilitates oxygen vacancy generation. The Ti layer can be in direct contact with a hafnium oxide ($HfO_2$) layer such that oxygen atoms can be easily transferred from the $HfO_2$ layer to the Ti layer. The exemplary embodiments of the present invention thus disclose resistive random access memory (RRAM) cells that involve a replacement oxygen reactive layer. The replacement oxygen reactive layer can be Ti. The replacement oxygen reactive layer can be employed as a top electrode to enable the formation of the Ti layer directly contacting the $HfO_2$ layer with a very clean interface.

RESISTIVE SWITCHING MEMORY WITH REPLACEMENT METAL ELECTRODE

BACKGROUND

Technical Field

The present invention relates generally to semiconductor devices, and more specifically, to a resistive switching memory with replacement metal electrode.

Description of the Related Art

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a cross-bar array of RRAMs, which can express a fully-connected neural network configuration.

SUMMARY

In accordance with an embodiment, a method is provided for facilitating oxygen vacancy generation in a resistive random access memory (RRAM) device. The method includes forming a RRAM stack having a first electrode and at least one sacrificial layer, encapsulating the RRAM stack with a dielectric layer, constructing a via resulting in removal of the at least one sacrificial layer of the RRAM stack, the via extending to a high-k dielectric layer of the RRAM stack, and forming a second electrode in the via such that the second electrode extends laterally into cavities defined by the removal of the at least one sacrificial layer.

In accordance with another embodiment, a method is provided for facilitating oxygen vacancy generation in a resistive random access memory (RRAM) device. The method includes forming a RRAM stack including a bottom electrode, a high-k dielectric layer, and a sacrificial top electrode, constructing a via resulting in removal of the sacrificial top electrode of the RRAM stack, and forming a replacement top electrode in the via, the replacement top electrode directly contacting sidewalls of the via such that depressions defined by the removal of the sacrificial top electrode are occupied by the replacement top electrode.

In accordance with yet another embodiment, a semiconductor device is provided for facilitating oxygen vacancy generation in a resistive random access memory (RRAM) device. The semiconductor device includes a RRAM stack disposed over a first conductive material, the RRAM stack including a bottom electrode, a high-k dielectric layer, and a replacement top electrode, the replacement top electrode extending within depressions defined by a dielectric material encapsulating the RRAM stack and a second conductive material disposed within the replacement top electrode.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing resistive random access memory (RRAM) devices. The RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Embodiments in accordance with the present invention provide methods and devices for employing a sacrificial top electrode for a RRAM stack and replacing the sacrificial top electrode later in the process flow with a reactive top electrode that facilitates oxygen vacancy generation in the metal oxide layer. As a result, the systems and methods of the exemplary embodiments of the present invention move the generation of oxygen vacancies later in the integration flow and eliminate the need for careful RRAM stack patterning and robust encapsulation to block external oxygen.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
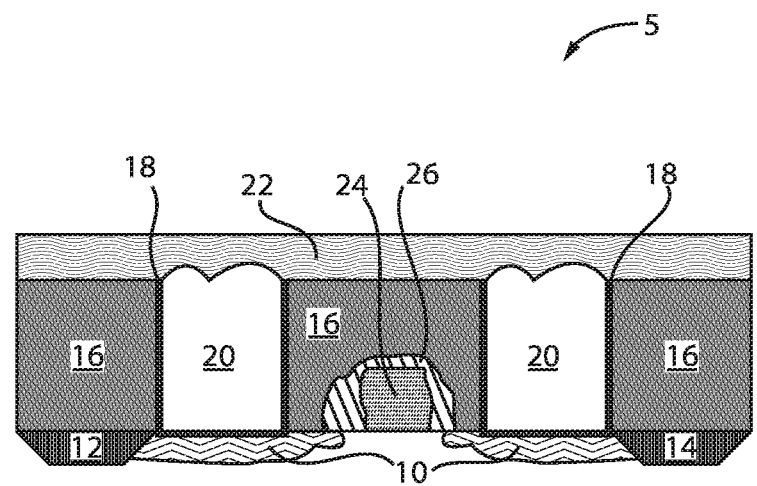
FIG. 1 is a cross-sectional view of a semiconductor structure including a MOSFET with via contacts to source and drain regions, in accordance with an embodiment of the present invention.

FIG. 1 is a cross-sectional view of a semiconductor structure including a MOSFET with via contacts to source and drain regions, in accordance with an embodiment of the present invention.

A semiconductor structure 5 can be formed over a semiconductor substrate (not shown). Shallow trench isolation (STI) regions 12, 14 can be formed on the substrate. The STI regions 12, 14 can be formed on opposed ends of the substrate. Source/drain regions 10 can be formed adjacent the STI regions 12, 14. Dielectric material 16 can be formed over the STI regions 12, 14. The dielectric material 16 can directly contact the STI regions 12, 14.

A gate 24 can be formed between the source/drain regions 10 to form a field effect transistor (FET). Spacers 26 can be formed adjacent the gate 24. The dielectric material 16 can also be deposited over the gate 24 and spacers 26. A conductive liner 18 and metal fill 20 can be constructed over the source/drain regions 10. The conductive liner 18 and metal fill 20 can be formed on opposed ends of the gate 24. A dielectric layer 22 can then be deposited over the metal fill 20, as well as over the dielectric material 16. The dielectric layer 22 can be, e.g., a SiN layer 22.

The source/drain regions 10 can be formed on the substrate adjacent the gate 24. The source/drain regions 10 can be formed by an epitaxial growth process or by incorporating a dopant into the substrate. The epitaxial layers can be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other processes. The epitaxial growth can include, for example, silicon, silicon germanium, and/or carbon doped silicon (Si:C) silicon, and can be doped during deposition by adding a dopant or impurity.

The shallow trench isolation (STI) regions 12, 14 can be formed by etching a trench in the doped bottom source/drain regions 10 utilizing a conventional dry etching process such as reactive ion etch (RIE) or plasma etching.

The dielectric material 16 can be formed from, for example, a low-k dielectric material (with k<4.0), including but not limited to, silicon oxide, silicon nitride, silicon dioxide, spin-on-glass, a flowable oxide, a high density plasma oxide, borophosphosilicate glass (BPSG), or a combination including at least one of the foregoing. The dielectric material 16 can be deposited by a deposition process, including, but not limited to CVD, PVD, plasma enhanced CVD, atomic layer deposition (ALD), evaporation, chemical solution deposition, or like processes. The dielectric material can have a thickness of 50 to 1,000 nm, for example, 100 to 800 nm, for example, 200 to 750 nm. In one example, the dielectric material 16 is BPSG.

The gate 24 can be gate stacks that are formed either by a replacement metal gate process, i.e., replacing a dummy gate (including a sacrificial gate material), or by gate-first process, i.e., directly forming the gate 24 on the substrate.

When a replacement metal gate process is used, the dummy gates are filled with a sacrificial material, for example, amorphous silicon (a-Si) or polycrystalline silicon (polysilicon). The sacrificial material can be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or a combination including at least one of the foregoing. The sacrificial gate material can be replaced with a metal gate stack. The gate stack can include metal gates formed, for example, by filling the dummy gate opening with one or more dielectric materials, one or more workfunction metals, and one or more metal gate conductor materials.

Gate spacers 26 can be arranged along sidewalls of the gate 24. The gate spacers 26 can include an insulating material, for example, silicon dioxide, silicon nitride, SiOCN, or SiBCN. Other non-limiting examples of materials for the gate spacers 26 can include dielectric oxides (e.g., silicon oxide), dielectric nitrides (e.g., silicon nitride), dielectric oxynitrides, or a combination including at least one of the foregoing. The gate spacer 26 material can be deposited by a deposition process, for example, chemical vapor deposition (CVD) or physical vapor deposition (PVD).

The metal(s) liners 18 can be disposed between the dielectric material regions 16 and a conductive metal 20. The metal liners 18 include, but are not limited to, TiN, TaN, Ti, Ta and combinations thereof.

A conductive metal 20 can be deposited over the dielectric material(s) and/or workfunction layer(s) to form the gate stacks. Non-limiting examples of conductive metals include aluminum (Al), platinum (Pt), gold (Au), tungsten (W), titanium (Ti), or a combination including at least one of the foregoing. The conductive metal 20 can be deposited by a suitable deposition process, for example, CVD, PECVD, PVD, plating, thermal or e-beam evaporation, and sputtering. A planarization process, for example, chemical mechanical planarization (CMP), can be performed to polish the surface of the conductive gate metal.

Figure 2:
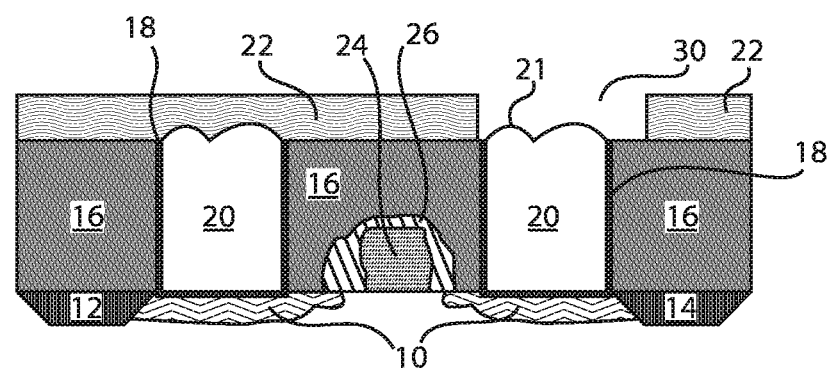
FIG. 2 is a cross-sectional view of the semiconductor structure of FIG. 1 where the dielectric layer is etched to form a recess exposing at least one contact via, in accordance with an embodiment of the present invention.

FIG. 2 is a cross-sectional view of the semiconductor structure of FIG. 1 where the dielectric layer is etched to form a recess exposing at least one contact via, in accordance with an embodiment of the present invention.

In various example embodiments, the SiN layer 22 is etched to form an opening or recess 30 over at least one metal fill 20. A top surface 21 of the metal fill 20 is thus exposed.

Figure 3:
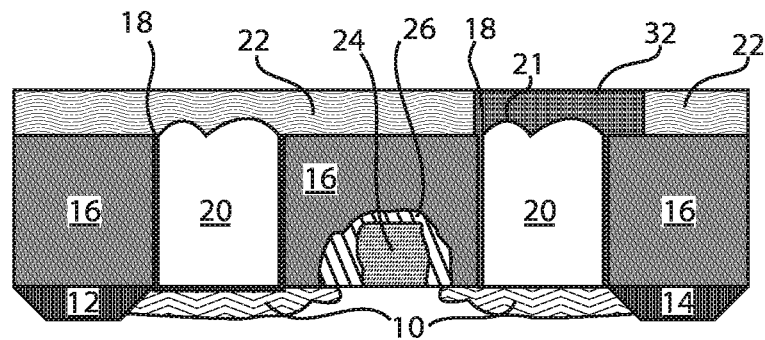
FIG. 3 is a cross-sectional view of the semiconductor structure of FIG. 2 where a barrier layer is formed within the recess, in accordance with an embodiment of the present invention.

FIG. 3 is a cross-sectional view of the semiconductor structure of FIG. 2 where a barrier layer is formed within the recess, in accordance with an embodiment of the present invention.

In various example embodiments, a barrier layer 32 is formed within the recess 30. The barrier layer 32 can be, e.g. a titanium nitride (TiN) layer. The barrier layer 32 extends over an entire upper surface of the metal fill 20. The barrier layer 32 directly contacts the entire upper surface of the metal fill 20 and extends partially over the dielectric material 16.

In various exemplary embodiments, the height of the barrier layer 32 can be reduced by chemical-mechanical polishing (CMP) and/or etching. Therefore, the planarization process can be provided by CMP. Other planarization process can include grinding and polishing.

Figure 4:
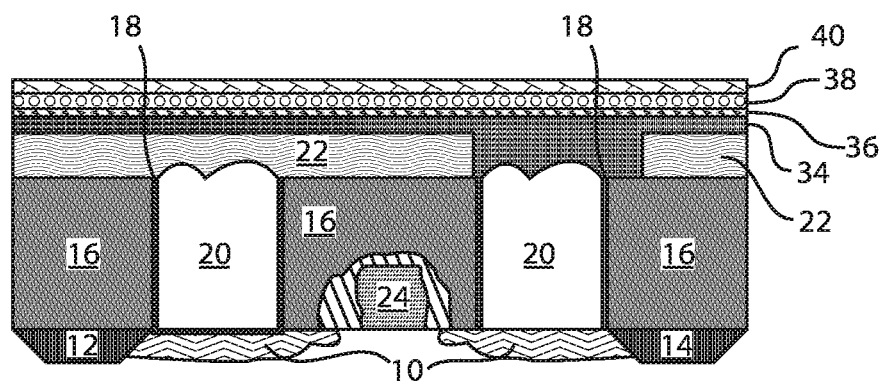
FIG. 4 is a cross-sectional view of the semiconductor structure of FIG. 3 where a resistive random access memory (RRAM) stack is formed, in accordance with an embodiment of the present invention.

FIG. 4 is a cross-sectional view of the semiconductor structure of FIG. 3 where a resistive random access memory (RRAM) stack is formed, in accordance with an embodiment of the present invention.

In various example embodiments, a RRAM stack is formed. The RRAM stack includes a first layer 34, a second layer 36, a third layer 38, and a fourth layer 40. The first layer 34 can be, e.g., a TiN layer, the second layer 36 can be, e.g., a high-k dielectric layer, and the third layer 38 can be, e.g., a sacrificial TiN layer. The fourth layer can be a SiN hardmask layer. The second layer 36 can be any type of high-k dielectric layer, such as, but not limited to, $HfO_2$, $HfSiO$, $HfSiON$, $HfZrO$, $Ta_2O_5$, $TiO_2$, $La_2O_3$, $Y_2O_3$, $Al_2O_3$, and mixtures thereof. The first and third layers 34, 38 can be referred to as metal layers formed of a thermally stable metal, such as TiN, TaN, TaC, TiAlN, TaAlN, or their derivatives. The first layer 34 can be referred to as a bottom electrode or first electrode.

Figure 5:
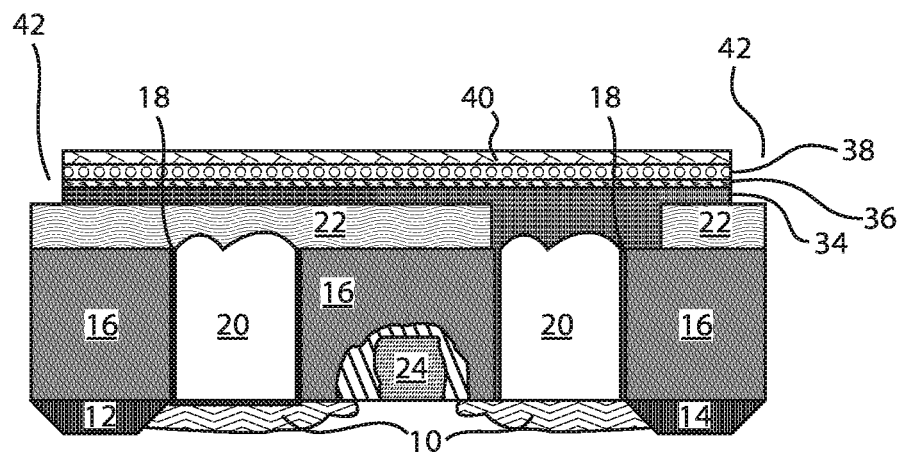
FIG. 5 is a cross-sectional view of the semiconductor structure of FIG. 4 where the RRAM stack is etched to open alignment marks, in accordance with an embodiment of the present invention.

FIG. 5 is a cross-sectional view of the semiconductor structure of FIG. 4 where the RRAM stack is etched to open alignment marks, in accordance with an embodiment of the present invention.

In various example embodiments, the RRAM stack is etched to form recesses 42 on opposed ends thereof. This step makes the alignment marks visible for the subsequent lithography step.

Figure 6:
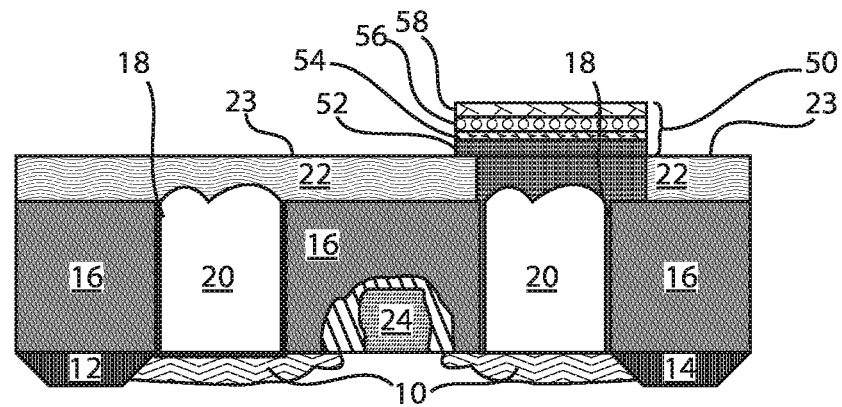
FIG. 6 is a cross-sectional view of the semiconductor structure of FIG. 5 where the RRAM stack is patterned, in accordance with an embodiment of the present invention.

FIG. 6 is a cross-sectional view of the semiconductor structure of FIG. 5 where the RRAM stack is patterned, in accordance with an embodiment of the present invention.

In various example embodiments, a lithographic stack can be formed over the RRAM stack. The lithographic stack can include, in one example, an organic planarization layer (OPL) or organic dielectric layer (ODL) formed over the RRAM stack. Additionally, an anti-reflective coating (ARC) layer and a photoresist layer can be formed over portions of the OPL in another example.

A photolithography process usually includes applying a layer of photoresist material (e.g., a material that will react when exposed to light), and then selectively exposing portions of the photoresist to light or other ionizing radiation (e.g., ultraviolet, electron beams, X-rays, etc.), thereby changing the solubility of portions of the material. The resist is then developed by washing the resist with a developer solution, such as, e.g., tetramethylammonium hydroxide (TMAH), thereby removing non-irradiated (in a negative resist) or irradiated (in a positive resist) portions of the resist layer.

The patterning of the RRAM results in RRAM stack 50 formed over the conductive fill 20. The RRAM stack 50 includes layers 52, 54, 56, 58. As noted above, layer 52 can be, e.g., a TiN layer, layer 54 can be, e.g., a $HFO_2$ layer, layer 56 can be, e.g., a sacrificial TiN layer, and layer 58 can be a SiN hardmask. The patterning of the RRAM further results in a top surface 23 of the SiN layer 22 to be exposed. The RRAM stack 50 is substantially aligned with the source/drain region 10 of the field effect transistor (FET).

Figure 7:
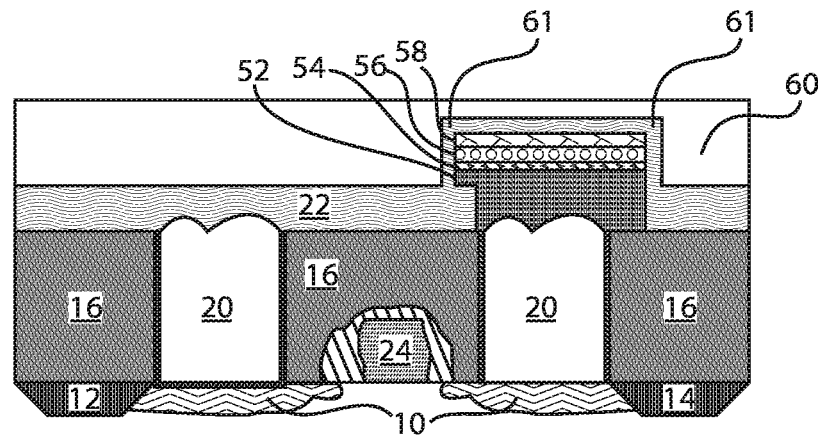
FIG. 7 is a cross-sectional view of the semiconductor structure of FIG. 6 where SiN encapsulation takes place for the RRAM stack followed by oxide deposition, in accordance with an embodiment of the present invention.

FIG. 7 is a cross-sectional view of the semiconductor structure of FIG. 6 where SiN encapsulation takes place for the RRAM stack followed by oxide deposition, in accordance with an embodiment of the present invention.

In various example embodiments, the RRAM stack 50 is encapsulated by a SiN layer 61. Subsequently, a dielectric layer 60 is deposited. The dielectric layer 60 can be, e.g., a silicon dioxide layer. The dielectric layer 60 can be an interlayer dielectric (ILD).

The ILD 60 can include any materials known in the art, such as, for example, porous silicates, carbon doped oxides, silicon dioxides, silicon nitrides, silicon oxynitrides, or other dielectric materials. The ILD 60 can be formed using any method known in the art, such as, for example, chemical vapor deposition, plasma enhanced chemical vapor deposition, atomic layer deposition, or physical vapor deposition. The ILD 60 can have a thickness ranging from about 25 nm to about 200 nm.

The dielectric material of layer 60 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Figure 8:
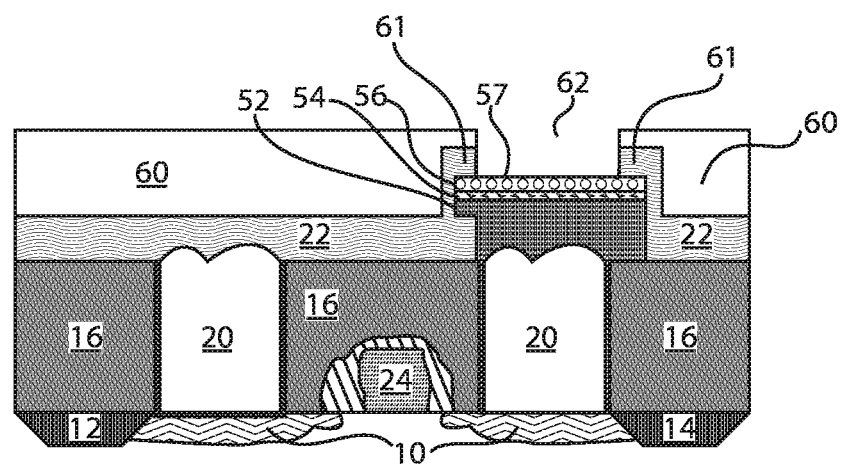
FIG. 8 is a cross-sectional view of the semiconductor structure of FIG. 7 where a via is formed over the RRAM stack, in accordance with an embodiment of the present invention.

FIG. 8 is a cross-sectional view of the semiconductor structure of FIG. 7 where a via is formed over the RRAM stack, in accordance with an embodiment of the present invention.

In various example embodiments, a via 62 is formed over the RRAM stack 50. The creation of the via 62 results in exposure of a top surface 57 of the sacrificial TiN layer 56.

Figure 9:
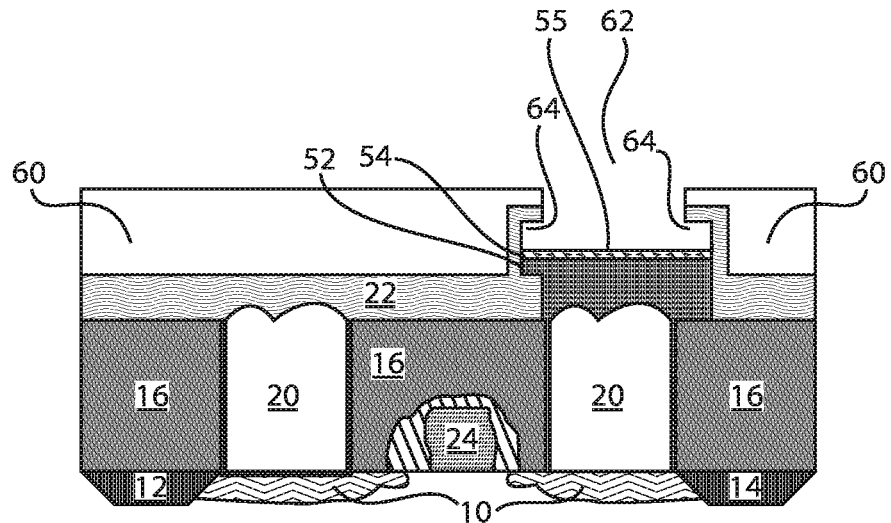
FIG. 9 is a cross-sectional view of the semiconductor structure of FIG. 8 where a sacrificial layer of the RRAM stack is removed, in accordance with an embodiment of the present invention.

FIG. 9 is a cross-sectional view of the semiconductor structure of FIG. 8 where a sacrificial layer of the RRAM stack is removed, in accordance with an embodiment of the present invention.

In various example embodiments, the sacrificial TiN layer 56 is removed to expose a top surface 55 of the $HFO_2$ layer 54. The removal of the sacrificial TiN layer 56 results in opening or divots or indents or depressions or cavities 64 formed within the via 62 and adjacent the SiN liner or layer 61. The sacrificial TiN layer 56 can be removed by, e.g., wet etching. The wet etch process can be SC1 or hydroperoxide.

Figure 10:
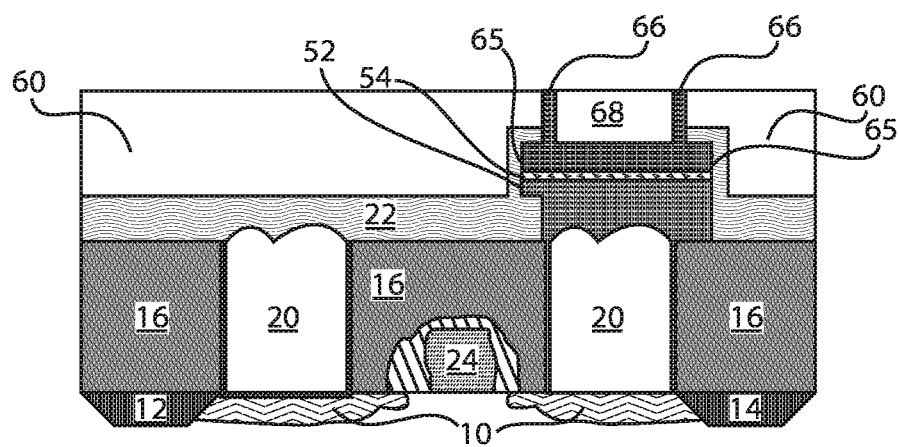
FIG. 10 is a cross-sectional view of the semiconductor structure of FIG. 9 where a reactive electrode is deposited, in accordance with an embodiment of the present invention.

FIG. 10 is a cross-sectional view of the semiconductor structure of FIG. 9 where a reactive electrode is deposited, in accordance with an embodiment of the present invention.

In various example embodiments, a reactive electrode 66 is deposited and a metal fill 68 takes place. The reactive electrode 66 is a substantially U-shaped electrode with projections or protrusions 65. The reactive electrode 66 extends into openings or divots 64 created by the removal of the sacrificial TiN layer 56. Stated differently, the reactive electrode 66 directly contacts sidewalls of the via 62, in its entirety, the via 62 created over the RRAM stack 50. The reactive electrode 66 can be referred to as a top electrode or top replacement electrode. Thus, the RRAM stack 50 can include a bottom electrode 52, a dielectric 54, and a top replacement electrode 66 (or reactive electrode 66). Top electrode or reactive electrode 66 can be, e.g., ALD TiN/Al-containing alloy (such as TiAlC)/TiN. In another example, top electrode or reactive electrode 66 can be, e.g., PVD Ti, Al, TiN, and laminates/alloys thereof.

In various exemplary embodiments, the height of the metal fill 68 can be reduced by chemical-mechanical polishing (CMP) and/or etching. Therefore, the planarization process can be provided by CMP. Other planarization process can include grinding and polishing.

Therefore, the reactive metal 66 for the RRAM stack 50 is present on the sidewall of the via on the RRAM stack 50. The sacrificial top electrode 56 for the RRAM stack 50 is thus replaced later in the process flow with a reactive top electrode 66 that facilitates oxygen vacancy generation in the metal oxide layer. As a result, the systems and methods of the exemplary embodiments move the generation of oxygen vacancies later in the integration flow and eliminate the need for careful RRAM stack patterning and robust encapsulation to block external oxygen. Stated differently, a dummy layer or sacrificial layer is employed and then replaced after the contact via formation. Consequently, the formation of a unique top electrode structure is introduced in the process flow for a planar RRAM device.

Therefore, the via contact on the RRAM stack can be formed in accordance with the following sequence, that is, creating a via contact, removing the sacrificial TiN layer by wet etching, depositing a reactive metal electrode, optionally depositing a TaN barrier layer, and filling the via with a low resistivity metal such as W, Cu, Al, etc. Oxygen vacancies in the metal oxide layer are formed at the reactive metal electrode deposition after the via opening. The formation or creation of the reactive metal electrode eliminates the need for damage suppression during RRAM stack patterning, robust encapsulation during the interlayer dielectric level processing, thus resulting in RRAM density scaling and reduced device variability.

Figure 11:
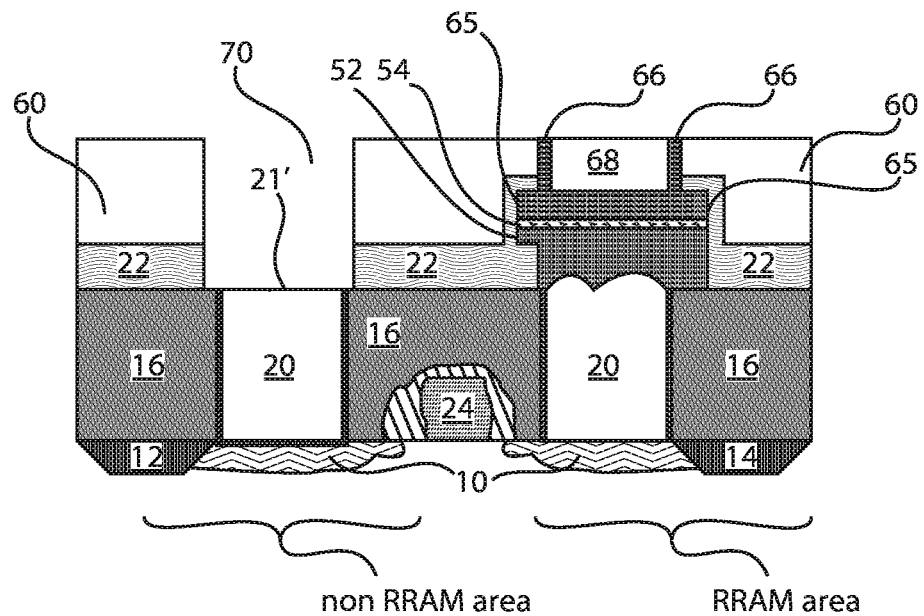
FIG. 11 is a cross-sectional view of the semiconductor structure of FIG. 10 where a via is opened in the non-RRAM area of the semiconductor device and then the remaining sacrificial layers are removed, in accordance with an embodiment of the present invention.

FIG. 11 is a cross-sectional view of the semiconductor structure of FIG. 10 where a via is opened in the non-RRAM area of the semiconductor device, and then the remaining sacrificial layers are removed, in accordance with an embodiment of the present invention.

In various example embodiments, a second via 70 is created to the top surface 21' of metal fill 20 in the non-RRAM area.

Figure 12:
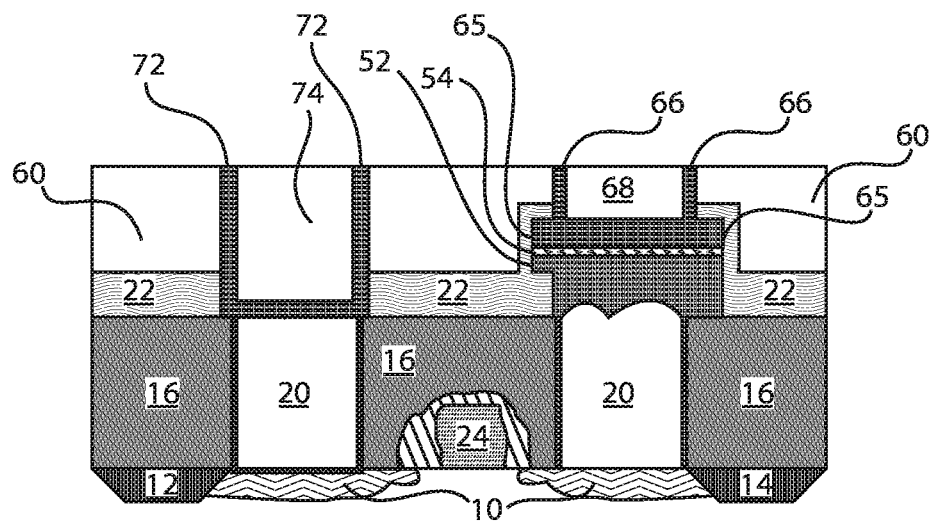
FIG. 12 is a cross-sectional view of the semiconductor structure of FIG. 11 where a metal fill takes place in the non-RRAM area, in accordance with an embodiment of the present invention.

FIG. 12 is a cross-sectional view of the semiconductor structure of FIG. 11 where a metal fill takes place in the non-RRAM area, in accordance with an embodiment of the present invention.

In various example embodiments, a conductive liner 72 and a metal fill 74 takes place in the recess created by the second via 70 in the non-RRAM area. The conductive liner 72 can be, e.g., a TaN barrier layer and the metal fill 74 can be, e.g., W.

The metallization can be a single damascene metallization. Thus, only single damascene metallization is needed for the trench, thus enabling dynamic reflow or other fill techniques that are sensitive to pattern and profile needs. The conductive material 74 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 74 can be reduced by chemical-mechanical polishing (CMP) and/or etching. Therefore, the planarization process can be provided by CMP. Other planarization process can include grinding and polishing.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

In conclusion, the exemplary embodiments of the present invention employ a method of making a resistive switching memory with a replacement metal electrode by creating a dummy top electrode for RRAM stack and replacing it later in the process flow with a reactive top electrode, which facilitates oxygen vacancy generation in the metal oxide layer. The method includes RRAM stack (TiN/HfO$_2$/Dummy TiN) and SiN hardmask deposition, patterning RRAM stack, SiN encapsulation deposition followed by oxide deposition and polish, opening Via on RRAM stack, removing dummy electrode (TiN) by wet etching, deposition of reactive electrode (ALD TiN/Al-containing alloy and laminates/alloys thereof), optional barrier layer, and deposition of low resistivity metal (e.g., W) followed by CMP. Oxygen vacancies in the metal oxide layer are formed at the reactive metal electrode deposition after the via opening. This eliminates the need for damage suppression during RRAM stack patterning and robust encapsulation during the interlayer dielectric level processing, resulting in RRAM density scaling and reduced device variability.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing a resistive switching memory with replacement metal electrode (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for facilitating oxygen vacancy generation in a resistive random access memory (RRAM) device, the method comprising:
   forming a RRAM stack having a first electrode and at least one sacrificial layer;
   encapsulating the RRAM stack with a dielectric layer;
   constructing a via resulting in removal of the at least one sacrificial layer of the RRAM stack, the via extending to a high-k dielectric layer of the RRAM stack; and
   forming a second electrode in the via such that the second electrode extends laterally into cavities defined by the removal of the at least one sacrificial layer.

2. The method of claim 1, wherein the second electrode directly contacts sidewalls of the via in its entirety.

3. The method of claim 2, further comprising filling the second electrode with a conductive material.

4. The method of claim 3, wherein the second electrode is constructed from a titanium nitride/aluminum (Al)-containing alloy/titanium nitride deposited by atomic layer deposition (ALD).

5. The method of claim 4, wherein the first electrode is constructed from titanium nitride (TiN).

6. The method of claim 1, wherein the RRAM stack is aligned with a source/drain region of a field effect transistor (FET).

7. The method of claim 1, wherein the dielectric layer encapsulating the RRAM stack is a silicon nitride (SiN) layer.

8. A method for facilitating oxygen vacancy generation in a resistive random access memory (RRAM) device, the method comprising:
- forming a RRAM stack including a bottom electrode, a high-k dielectric layer, and a sacrificial top electrode;
- constructing a via resulting in removal of the sacrificial top electrode of the RRAM stack; and
- forming a replacement top electrode in the via, the replacement top electrode directly contacting sidewalls of the via such that depressions defined by the removal of the sacrificial top electrode are occupied by the replacement top electrode.

9. The method of claim 8, further comprising encapsulating the RRAM stack with a silicon nitride (SiN) layer before constructing the via.

10. The method of claim 8, wherein the replacement top electrode directly contacts the sidewalls of the via in its entirety.

11. The method of claim 10, further comprising filling the replacement top electrode with a conductive material.

12. The method of claim 11, wherein the replacement top electrode is constructed from a titanium nitride/aluminum (Al)-containing alloy/titanium nitride deposited by atomic layer deposition (ALD).

13. The method of claim 12, wherein the bottom electrode is constructed from titanium nitride (TiN).

14. The method of claim 8, wherein the RRAM stack is aligned with a source/drain region of a field effect transistor (FET).

15. The method of claim 14, wherein the bottom electrode of the RRAM stack directly contacts a conductive material formed over the source/drain region.

* * * * *